(12) United States Patent
Nagatsuka

(10) Patent No.: US 10,643,009 B2
(45) Date of Patent: May 5, 2020

(54) SIMULATION APPARATUS

(71) Applicant: FANUC CORPORATION, Yamanashi (JP)

(72) Inventor: Yoshiharu Nagatsuka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 59 days.

(21) Appl. No.: 15/664,168

(22) Filed: Jul. 31, 2017

(65) Prior Publication Data

US 2018/0039720 A1 Feb. 8, 2018

(30) Foreign Application Priority Data

Aug. 4, 2016 (JP) .................................. 2016-153649

(51) Int. Cl.
*G06F 30/20* (2020.01)
(52) U.S. Cl.
CPC .................................. *G06F 30/20* (2020.01)
(58) Field of Classification Search
CPC ...... G06F 17/5009; G06F 30/20; G06F 30/25; G06F 30/27; G06F 30/28; G06F 2111/00; G06F 2119/22
USPC ...................................................... 703/2, 20
See application file for complete search history.

(56) References Cited

U.S. PATENT DOCUMENTS

| | | | | |
|---|---|---|---|---|
| 4,481,591 A | * | 11/1984 | Spongh ................ | G05B 19/427 318/568.14 |
| 4,912,650 A | * | 3/1990 | Tanaka ................. | G05B 19/406 318/568.13 |
| 5,084,826 A | * | 1/1992 | Hariki ............... | G05B 19/41815 700/248 |
| 5,133,047 A | * | 7/1992 | Hariki ................ | G05B 19/4182 700/262 |

(Continued)

FOREIGN PATENT DOCUMENTS

| | | |
|---|---|---|
| EP | 1310843 A2 | 5/2003 |
| GB | 2330666 A | 4/1999 |

(Continued)

OTHER PUBLICATIONS

Shoaei et al. ("Automatic Generation of Controllers for Collision-Free Flexible Manufacturing Systems", IEEE, 2010, pp. 368-373) (Year: 2010).*

(Continued)

*Primary Examiner* — Iftekhar A Khan
(74) *Attorney, Agent, or Firm* — Karceski IP Law, PLLC

(57) ABSTRACT

A simulation apparatus includes a backup information input unit that reads backup information containing parameters and operation programs of a plurality of automated machines operating according to interactive interlock signals; a virtual device generator that generates virtual devices of respective ones of the plurality of automated machines on the basis of the parameters contained in the backup information; an I/O association relationship storage that stores an association of the interlock signals between the plurality of (Continued)

automated machines; an I/O connecting unit that connects the interlock signals between the virtual devices generated in the virtual device generator in accordance with the association stored in the I/O association relationship storage; and a program executing unit that executes the operation programs read by the backup information input unit.

3 Claims, 5 Drawing Sheets

(56) References Cited

U.S. PATENT DOCUMENTS

| | | | | |
|---|---|---|---|---|
| 5,610,842 | A * | 3/1997 | Seki | G05B 19/4069 345/473 |
| 6,126,373 | A * | 10/2000 | Yee | B25J 13/02 414/5 |
| 6,268,853 | B1 * | 7/2001 | Hoskins | G05B 15/02 700/83 |
| 6,330,495 | B1 * | 12/2001 | Kaneko | B25J 9/1671 700/248 |
| 6,556,950 | B1 * | 4/2003 | Schwenke | G05B 17/02 700/83 |
| 6,642,922 | B1 * | 11/2003 | Noda | B25J 9/1671 345/419 |
| 6,853,881 | B2 * | 2/2005 | Watanabe | B25J 9/1671 219/121.63 |
| 7,194,396 | B2 * | 3/2007 | Watanabe | B25J 9/1671 345/418 |
| 8,589,122 | B2 * | 11/2013 | Nagatsuka | G05B 19/4069 703/1 |
| 9,363,304 | B2 * | 6/2016 | Folkmanis | G05B 19/0426 |
| 9,511,493 | B2 * | 12/2016 | Nomura | B25J 9/1671 |
| 9,547,301 | B2 * | 1/2017 | Seya | G05B 19/4063 |
| 2002/0120921 | A1 * | 8/2002 | Coburn | G05B 19/41885 717/140 |
| 2003/0090483 | A1 * | 5/2003 | Watanabe | B25J 9/1671 345/419 |
| 2003/0090489 | A1 * | 5/2003 | Watanabe | B25J 9/1671 345/473 |
| 2003/0090490 | A1 * | 5/2003 | Watanabe | B25J 9/1671 345/473 |
| 2003/0090491 | A1 * | 5/2003 | Watanabe | B25J 9/1671 345/473 |
| 2003/0100957 | A1 * | 5/2003 | Chaffee | G05B 19/042 700/18 |
| 2003/0118436 | A1 * | 6/2003 | Kameda | B65G 61/00 414/799 |
| 2004/0046736 | A1 * | 3/2004 | Pryor | A63F 13/02 345/156 |
| 2004/0073404 | A1 * | 4/2004 | Brooks | G05B 19/409 702/183 |
| 2004/0133312 | A1 * | 7/2004 | Watanabe | B25J 13/003 700/264 |
| 2005/0096892 | A1 * | 5/2005 | Watanabe | B25J 9/1671 703/7 |
| 2005/0179202 | A1 * | 8/2005 | French | A63B 24/0003 273/247 |
| 2007/0150093 | A1 * | 6/2007 | Nagatsuka | G05B 19/41815 700/235 |
| 2007/0213874 | A1 * | 9/2007 | Oumi | B25J 9/1697 700/245 |
| 2007/0276541 | A1 * | 11/2007 | Sawasaki | G05D 1/0246 700/253 |
| 2007/0282485 | A1 * | 12/2007 | Nagatsuka | B25J 9/1671 700/245 |
| 2008/0013825 | A1 * | 1/2008 | Nagatsuka | B25J 9/1671 382/153 |
| 2008/0163096 | A1 * | 7/2008 | Pannese | G05B 19/4069 715/772 |
| 2009/0069939 | A1 * | 3/2009 | Nagatsuka | B25J 9/1671 700/258 |
| 2009/0069943 | A1 * | 3/2009 | Akashi | B25J 9/1676 700/264 |
| 2009/0143928 | A1 * | 6/2009 | Ghaly | B61L 19/06 701/19 |
| 2009/0271169 | A1 * | 10/2009 | Minto | G09B 9/00 703/18 |
| 2010/0121489 | A1 * | 5/2010 | Inazumi | G05B 19/402 700/255 |
| 2010/0153073 | A1 * | 6/2010 | Nagatsuka | G05B 19/4069 703/1 |
| 2010/0211220 | A1 * | 8/2010 | Nishi | G05B 19/41825 700/248 |
| 2011/0288667 | A1 * | 11/2011 | Noda | B25J 9/1661 700/98 |
| 2012/0059514 | A1 * | 3/2012 | Suh | B25J 9/1658 700/245 |
| 2012/0109380 | A1 * | 5/2012 | Yoshida | G05B 19/4155 700/262 |
| 2012/0166165 | A1 * | 6/2012 | Nogami | B25J 9/1671 703/6 |
| 2012/0294509 | A1 * | 11/2012 | Matsumoto | B25J 5/007 382/153 |
| 2013/0013283 | A1 * | 1/2013 | Gam | G06F 30/33 703/21 |
| 2013/0116822 | A1 * | 5/2013 | Atohira | G05B 19/4097 700/255 |
| 2013/0238131 | A1 * | 9/2013 | Kondo | B25J 9/1697 700/259 |
| 2014/0088949 | A1 * | 3/2014 | Moriya | G05B 17/02 703/22 |
| 2014/0148949 | A1 * | 5/2014 | Graca | B25J 9/1682 700/248 |
| 2014/0214394 | A1 * | 7/2014 | Inoue | B25J 9/1671 703/13 |
| 2015/0261899 | A1 * | 9/2015 | Atohira | B25J 9/1687 703/7 |
| 2015/0277399 | A1 * | 10/2015 | Maturana | G05B 13/042 700/29 |
| 2015/0281319 | A1 * | 10/2015 | Maturana | G06F 9/5072 709/202 |
| 2015/0306768 | A1 * | 10/2015 | Liang | G05B 19/406 703/2 |
| 2015/0343635 | A1 * | 12/2015 | Linnell | B25J 9/1671 700/249 |
| 2016/0054723 | A1 * | 2/2016 | Nishi | B25J 9/1687 700/97 |
| 2016/0133502 | A1 * | 5/2016 | Won | H01L 21/68707 700/253 |
| 2016/0182309 | A1 * | 6/2016 | Maturana | G05B 19/41885 709/224 |
| 2016/0261717 | A1 * | 9/2016 | Yamada | G06F 3/04817 |
| 2017/0220017 | A1 * | 8/2017 | Nishi | G06F 30/20 |
| 2017/0220024 | A1 * | 8/2017 | Watanabe | B23P 19/04 |

FOREIGN PATENT DOCUMENTS

| | | | |
|---|---|---|---|
| JP | S63018403 | A | 1/1988 |
| JP | H11134017 | A | 5/1999 |
| JP | 2000024970 | A | 1/2000 |
| JP | 2003150218 | A | 5/2003 |
| JP | 2004148434 | A * | 5/2004 |
| JP | 2004148434 | A | 5/2004 |
| JP | 2010140359 | A | 6/2010 |
| JP | 2014-144524 | | 8/2014 |

OTHER PUBLICATIONS

Dumitracu et al. ("Virtual Commissioning As a Final Step in Digital Validation of the Robotic Manufacturing Systems", Proceedings in Manufacturing Systems, vol. 9, Issue 4, 2014, 215-220) (Year: 2014).*

Dahl et al. ("Integrated Virtual Preparation and Commissioning: supporting formal methods during automation systems development", IFAC—PapersOnLine 49-12 (2016) 1939-1944) (Year: 2016).*

Japanese Decision to Grant a Patent dated Jul. 31, 2018, for

(56) References Cited

OTHER PUBLICATIONS

Japanese Patent Application No. 2016-153649.
Search Report by Registered Searching Organization for Japanese Patent Application No. 2016-153659, dated Jul. 12, 2018.

* cited by examiner

SIMULATION APPARATUS

CROSS-REFERENCE TO RELATED APPLICATIONS

This application claims the benefit of and claims priority to Japanese Patent Application No. 2016-153649, filed on Aug. 4, 2016, the entire content of which is incorporated herein by reference.

FIELD OF THE INVENTION

The present invention relates to a simulation apparatus.

BACKGROUND OF THE INVENTION

Conventionally, when a robot program, which includes a signal control instruction for providing an interlock with a peripheral device, and a branch instruction, a standby instruction, and the like dependent on signal conditions, is executed with a simulator as it is, the disadvantage is that a desired operation cannot be obtained because no feedback signal is sent from the peripheral device. As a countermeasure to this disadvantage, a simulation apparatus is known which uses a separate file containing a command which is written in correspondence with a line of a robot program and used to set the state of a signal referred upon execution of the line of the robot program, or a command used to set the value of a data register (see Japanese Unexamined Patent Application, Publication No. 2014-144524, for example).

With this simulation apparatus that prepares the separate file containing a feedback signal preliminarily written in correspondence with the line of the robot program, the robot can operate upon reception of the feedback signal written in the separate file, in response to a signal control instruction for an interlock, and a branch instruction, a standby instruction, and the like dependent on the signal conditions.

SUMMARY OF THE INVENTION

One aspect of the present invention provides a simulation apparatus including: a backup information input unit that reads backup information containing parameters and operation programs of a plurality of automated machines operating according to interactive interlock signals; a virtual device generator that generates virtual devices of the respective automated machines on the basis of the parameters contained in the backup information read by the backup information input unit; an I/O association relationship storage that stores an association of the interlock signals between the automated machines; an I/O connecting unit that connects the interlock signals between the virtual devices generated in the virtual device generator in accordance with the association stored in the I/O association relationship storage; and a program executing unit that executes the operation programs read by the backup information input unit.

DESCRIPTION OF EMBODIMENTS

A simulation apparatus 1 according to one embodiment of the present invention will now be described with reference to the drawings.

The simulation apparatus 1 according to this embodiment is implemented by a calculator such as a personal computer.

Figure 1:
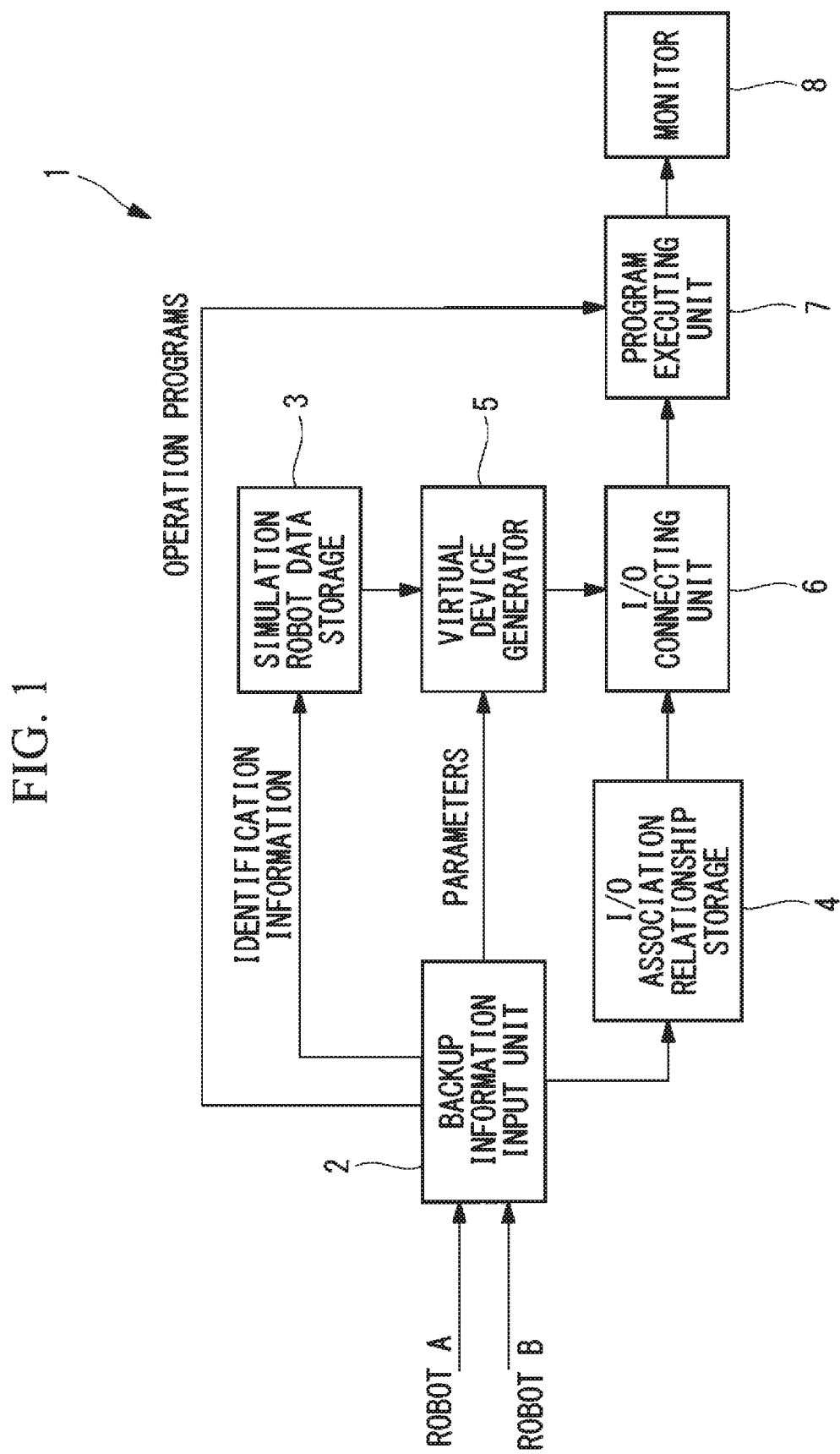
FIG. 1 is a block diagram showing a simulation apparatus according to one embodiment of the present invention.

As shown in FIG. 1, this simulation apparatus 1 is used for a simulation of a robot system in which a plurality of robots (automated machines) A and B share a space for operation, and includes: a backup information input unit 2 that reads backup information output from the robots A and B; a simulation robot data storage 3 that stores identification information on the robots A and B associated with simulation robot data; a storage (I/O association relationship storage) 4 that stores an association between interlock signals of the robots A and B; a simulation robot generator (virtual device generator) 5 that generates a simulation robot (virtual device) of each of the robots A and B on the basis of parameters, which are contained in the read backup information, and simulation robot data, which is read from the identification information; an I/O connecting unit 6 that connects interlock signals between the generated simulation robots in accordance with the association stored in the storage 4; a program executing unit 7 that executes an operation program contained in the read backup information on each of the robots A and B; and a monitor 8 that displays the execution results.

Backup information output from the robots A and B contains identification information on the robots A and B, parameters, such as acceleration along each axis, maximum speed, operation range, and tool coordinate system, and operation programs.

The simulation robot generator 5 is configured to generates software simulation robots that operate with the simulation apparatus 1 on the basis of the identification information on the robots A and B contained in the backup information output from the robots A and B, provides settings according to the acceleration along each axis, maximum speed, and operation range contained in the backup information, and then provides settings of tool coordinate systems.

In the storage 4, interlock signals in the I/O signals of the robots A and B contained in the backup information are stored in association with each other. To be specific, in the case of a robot system including two robots A and B, out of the robot A's external output signals DO(1) to DO(10), external output signals DO(1), DO(2), DO(5), DO(7), and DO(10) are interlock output signals. When, out of the robot B's external input signals DI(101) to DI(110), the external input signals DI(101) to DI(105) are associated with these interlock output signals, information indicating the association relationship as shown in FIG. 2 is stored in the storage 4.

Figure 2:
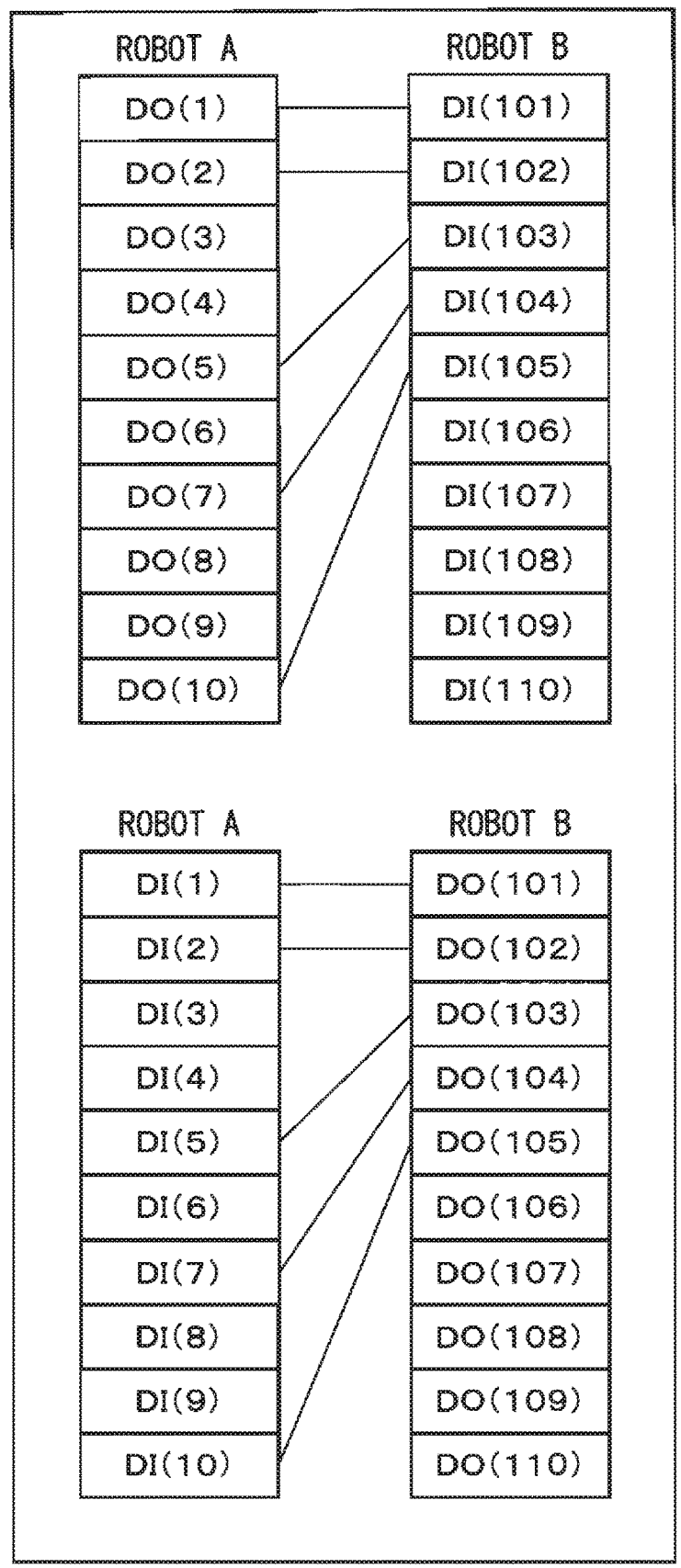
FIG. 2 is a diagram for explaining a storage included in the simulation apparatus shown in FIG. 1.

The example in FIG. 2 also shows association relationships between the robot A's external input signals DI(1) to DI(10) and the robot B's external output signals DO(101) to DO(110) in the same manner.

Input/output information for the robots A and B contained in the backup information is stored in the storage 4 as it is, and the association between the interlock signals of the two robots A and B may be set manually.

The I/O connecting unit 6 is configured to connect interlock signals between the simulation robots generated by the simulation robot generator 5 in accordance with the association stored in the storage 4.

Accordingly, operation programs for both of the robots A and B are executed by the program executing unit 7. When an external output signal is output from the external output written in the operation program for one robot A, an external input signal is input to the external input of the associated other robot B stored in the storage 4, and the operation program for the robot B is continued according to the input.

The operation of the simulation apparatus 1 with such a configuration will be described below.

Figure 3:
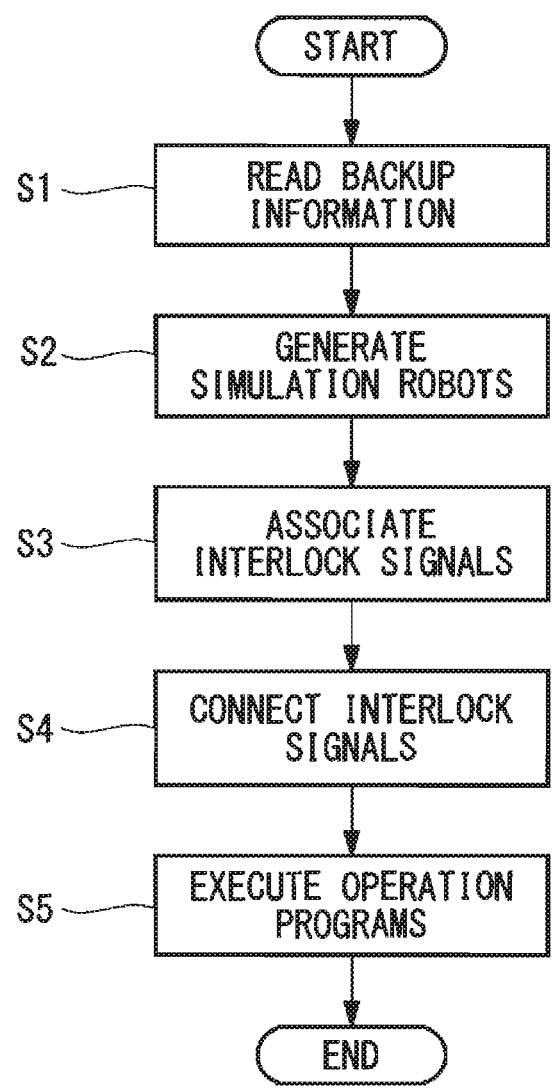
FIG. 3 is a flow chart for explaining the operation of the simulation apparatus shown in FIG. 1.

To simulate a robot system including two robots A and B by using the simulation apparatus 1 according to this embodiment, backup information is read from two robots A and B included in the robot system through the backup information input unit 2 as shown in FIG. 3 (Step S1).

Subsequently, the simulation robot generator 5 generates simulation robots, which operate in a software, for the respective robots A and B, from, out of the read backup information, identification information on the robots A and B, the parameters of operation and parameters of tool coordinate systems related to the robots A and B, and the like (Step S2).

To be specific, since the identification information on the robots A and B is read, templates of simulation robots stored in the simulation robot generator 5 in association with the identification information are read, and the parameters of operation and parameters of tool coordinate systems related to the robots A and B are assigned to the templates, thereby generating the simulation robots.

Further, I/O signals contained in the backup information for the two respective robots A and B read by the backup information input unit 2 are stored and interlock signals between the simulation robots are associated with each other as shown in FIG. 2 (Step S3).

The I/O connecting unit 6 connects the interlock signals between the simulation robots in accordance with the association stored in the storage 4, thereby generating simulation robots connected through an interlock (Step S4).

Afterwards, the operation programs read from the respective robots A and B by the backup information input unit 2 are executed by the program executing unit 7, so that the execution results are displayed on the monitor 8 (Step S5).

In this case, with the simulation apparatus 1 according to this embodiment, interlock signals contained in the backup information for the two robots A and B are associated with each other and stored in the storage 4, and the interlock information between two simulation robots generated by the simulation robot generator 5 are connected by the I/O connecting unit 6 in accordance with the association stored in the storage 4.

Consequently, when the operation programs are executed, the external output signals and output interlock signals of one simulation robot are recognized as the external input signals of the other simulation robot.

In particular, the advantage is that even if the operation state of each simulation robot varies upon a logic-based operation change or an operation for correction of the vision or the like, and the timing of the output of an interlock signal from one simulation robot deviates, the interlock signal input to the other simulation robot ensures an interlock, thereby avoiding an interference between the simulation robots. Thus, an accurate simulation with operations similar to those of the actual machines can be easily performed.

Figure 4:
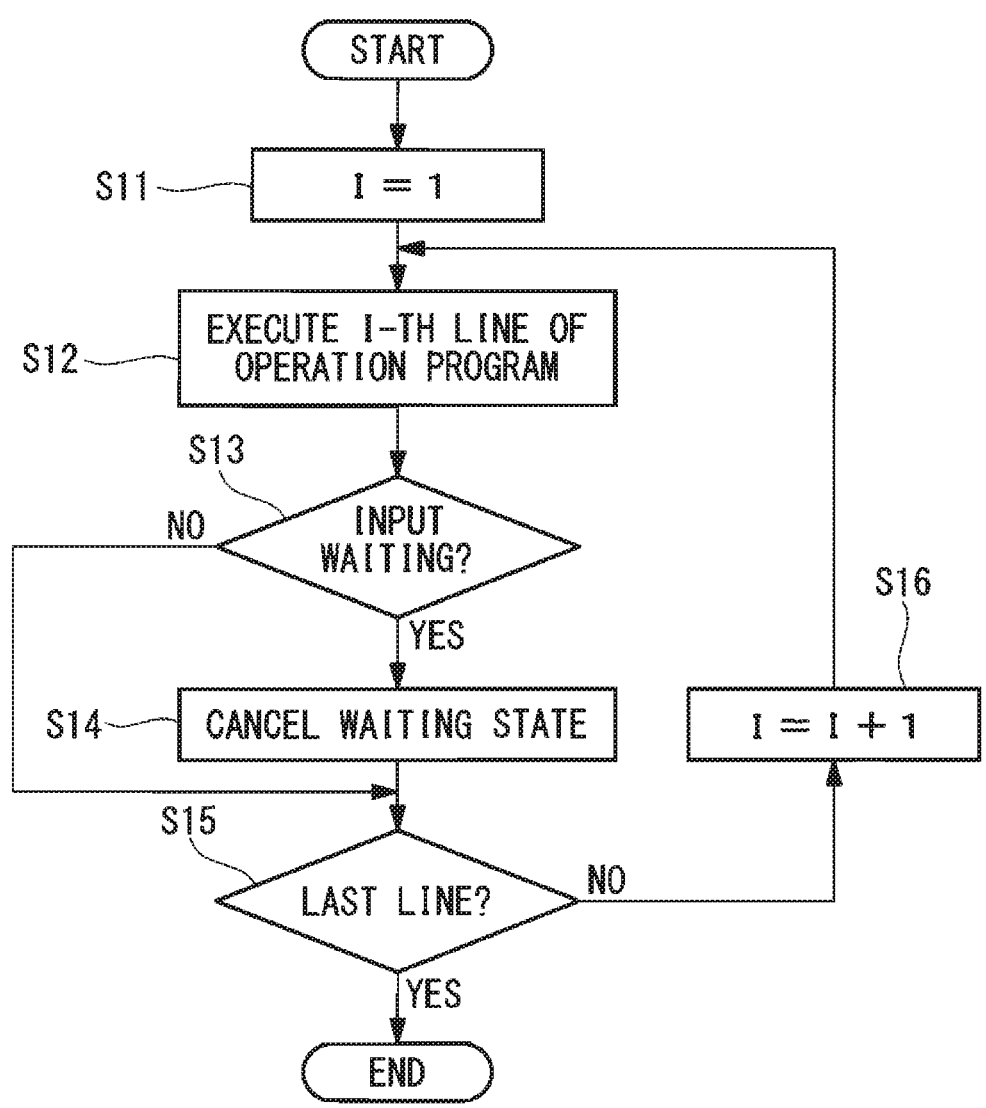
FIG. 4 is a flow chart for explaining the case where an operation program provided by the simulation apparatus shown in FIG. 1 features an I/O signal other than an interlock signal.

Although interlock signals between the simulation robots are associated with each other in the simulation apparatus 1 according to this embodiment, as shown in FIG. 4, the waiting state may be automatically cancelled in the input signal waiting state or the variable input waiting state established by an I/O signal other than the interlock signals.

In the example shown in FIG. 4, the line number I is initialized (Step S11), the I-th line of the operation program is executed (Step S12), and whether or not the input waiting state is active is determined (Step S13). If the input waiting state is active, the waiting state is canceled (Step S14). Subsequently, whether or not the current line is the last line is determined (Step S15). If it is the last line, the process ends. Otherwise, the line number I is incremented and the process is repeated from Step S12 (Step S16).

Since I/O signals other than the interlock signals directed at the other simulation robot has no impact on an interference between the robots A and B, cancelling the waiting state to proceed the operation program enables a smooth simulation.

Figure 5:
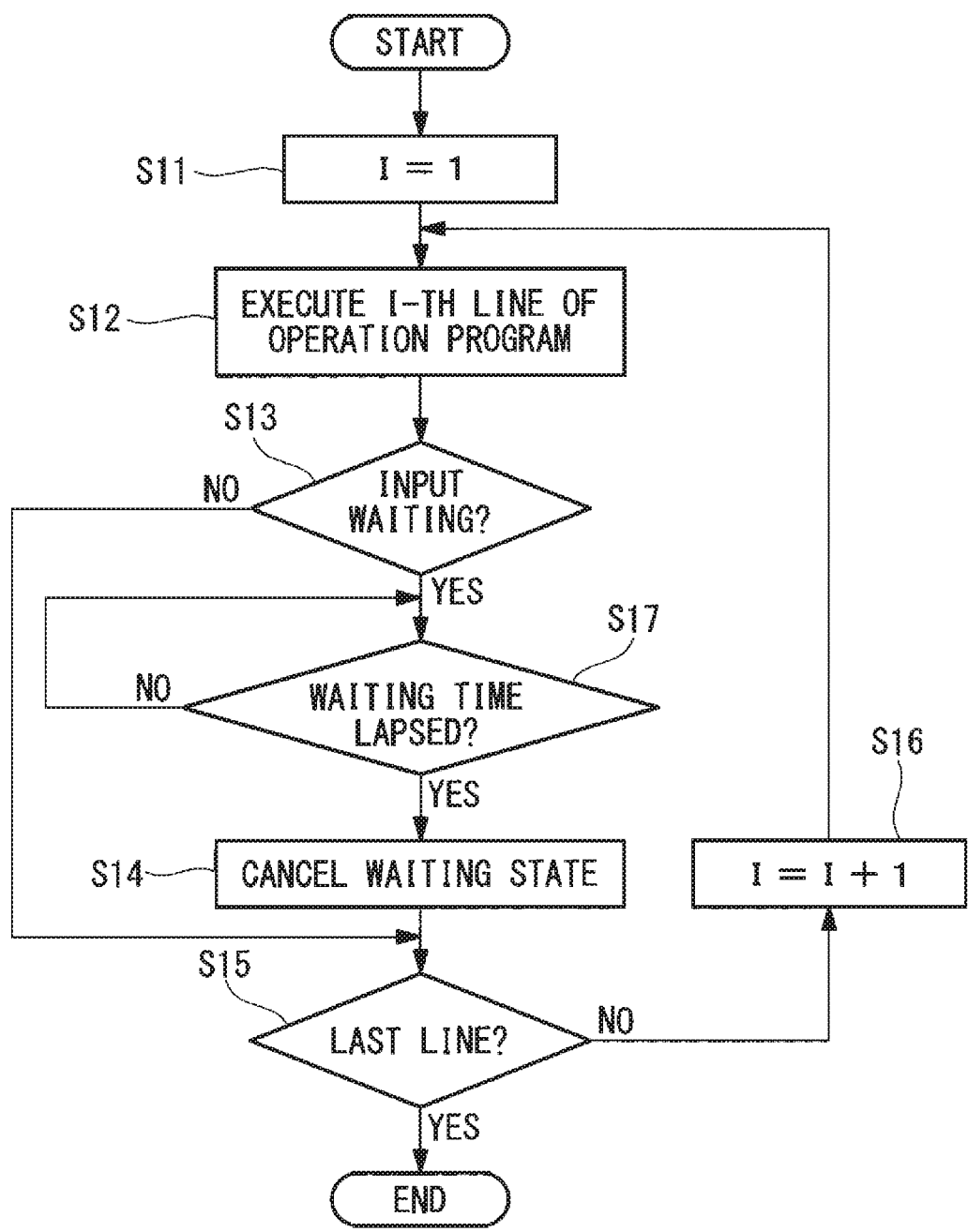
FIG. 5 is a flow chart showing a modification of FIG. 4.

In the variable input waiting state (Step S13), as shown in FIG. 5, an appropriate waiting time is set and the waiting state may be automatically cancelled (Step S14) after the lapse of the set waiting time (Step S17).

In addition, as the execution results of the simulation for the operation programs displayed on the monitor 8, this embodiment may employ the indication (e.g., line number) of the fact that lines in the operation programs of the two simulation robots have been executed. Alternatively, three-dimensional models of the robots A and B may be stored in the simulation robot data storage 3 in association with identification information, and three-dimensional models of the simulation robots generated in the simulation robot generator 5 may be displayed and operated on the monitor 8. Hence, the simulation of the robot system is more easily understandable in a visual way.

Moreover, although this embodiment illustrates the case where a robot system including two robots A and B is simulated, it is also applicable to the case where a robot system including three or more robots is simulated.

Further, this embodiment shows the robots A and B as examples of automated machines for outputting backup information. Alternatively, it is applicable in a system including a computerized numerically controlled (CNC) machine tool, which can obtain backup information like the robots A and B and operates while outputting interlock signals, and robots.

In addition, this embodiment performs a simulation by generating two or more simulation robots in a single personal computer. Alternatively, different simulation robots may be generated in different personal computers, and interlock signals may travel through connection between I/O signals between personal computers.

Further, although this embodiment illustrates the case where interlock signals are contained in backup information, it is also applicable to the case where interlock signals are read independently of backup information.

From the above-described embodiment, the following invention is derived.

One aspect of the present invention provides a simulation apparatus including: a backup information input unit that reads backup information containing parameters and operation programs of a plurality of automated machines operating according to interactive interlock signals; a virtual device generator that generates virtual devices of the respective automated machines on the basis of the parameters contained in the backup information read by the backup information input unit; an I/O association relationship storage that stores an association of the interlock signals between the automated machines; an I/O connecting unit that connects the interlock signals between the virtual devices generated in the virtual device generator in accordance with the association stored in the I/O association relationship storage; and a program executing unit that executes the operation programs read by the backup information input unit.

According to this aspect, when backup information containing parameters and operation programs is read from the plurality of automated machines by the backup information input unit, virtual devices of the respective automated machines are generated by the virtual device generator on the basis of the parameters contained in the read backup information. For the generated virtual devices, interlock signals between the automated machines are connected by the I/O connecting unit in accordance with the association stored in the I/O association relationship storage. Accordingly, upon execution of the operation programs by the program executing unit, interlock signals output from one virtual device are recognized by the other virtual device, so that virtual devices can be operated in an interactive manner through an interlock. Consequently, a simulation in which the states of the actual machines are accurately simulated is easily performed.

In this aspect, the automated machines may be robots, and the virtual device generator may generate virtual devices including three-dimensional models of the robots on the basis of the parameters of the robots.

Thus, with virtual devices including three-dimensional models of the robots generated by the virtual device generator, a simulation can be easily performed while checking the operations of the robots through the three-dimensional models.

Further, in this aspect, the program executing unit may cancel an input waiting state established by an I/O signal other than the interlock signals.

Accordingly, when the program executing unit cancels the input waiting state, a smooth simulation with no delay can be performed for I/O signals other than interlock signals, which are independent of an interference with the other automated machine.

The invention claimed is:

1. A simulation apparatus, comprising:
  a backup information input unit that reads backup information containing parameters and operation programs of a plurality of automated machines operating according to interactive interlock signals;
  a virtual device generator that generates virtual devices of respective ones of the plurality of automated machines on the basis of the parameters contained in the backup information read by the backup information input unit;
  an I/O association relationship storage that stores an association of the interlock signals between the plurality of automated machines;
  an I/O connecting unit that connects the interlock signals between the virtual devices generated in the virtual device generator in accordance with the association stored in the I/O association relationship storage; and
  a program executing unit that recognizes the interlock signals connected by the I/O connecting unit as input/output signals between the virtual devices generated in the virtual devices generator and executes the operation programs read by the backup information input unit according to the recognized input/output signals such that the virtual devices are operated in an interactive manner through an interlock based on the interlock signals connected by the I/O connecting unit.

2. The simulation apparatus according to claim 1, wherein the plurality of automated machines are robots, and
  the virtual device generator generates the virtual devices including three-dimensional models of the robots on the basis of the parameters of the robots.

3. The simulation apparatus according to claim 1, wherein the program executing unit cancels an input waiting state established by an I/O signal other than the interlock signals.

* * * * *